United States Patent
Lu et al.

(10) Patent No.: US 10,741,475 B2
(45) Date of Patent: Aug. 11, 2020

(54) DELIVERY ROLL AND METHOD FOR MANUFACTURING THEREOF

(71) Applicant: NOLATO SILIKONTEKNIK AB, Hallsberg (SE)

(72) Inventors: Xiongwei Lu, Tianjian (CN); Mark D. Kittel, Berea, OH (US); Jussi Myllyluoma, Sollentuna (SE)

(73) Assignee: NOLATO SILIKONTEKNIK AB, Hallsberg (SE)

( * ) Notice: Subject to any disclaimer, the term of this patent is extended or adjusted under 35 U.S.C. 154(b) by 1 day.

(21) Appl. No.: 16/262,979

(22) Filed: Jan. 31, 2019

(65) Prior Publication Data
US 2019/0237387 A1    Aug. 1, 2019

(30) Foreign Application Priority Data
Jan. 31, 2018   (EP) .................................... 18154348

(51) Int. Cl.
| | | |
|---|---|---|
| *H01L 23/10* | (2006.01) | |
| *H01L 23/34* | (2006.01) | |
| *H01L 23/427* | (2006.01) | |
| *H01L 21/683* | (2006.01) | |
| *H01L 21/67* | (2006.01) | |
| *H01L 23/373* | (2006.01) | |
| *H01L 23/42* | (2006.01) | |

(52) U.S. Cl.
CPC .... *H01L 23/4275* (2013.01); *H01L 21/67121* (2013.01); *H01L 21/6836* (2013.01); *H01L 23/373* (2013.01); *H01L 23/42* (2013.01)

(58) Field of Classification Search
CPC ................ H01L 23/9735; H01L 33/64; H01L 2224/48137; H01L 21/4882; H01L 25/0753; H01L 23/36

USPC ............... 257/753, 706, 707, 781, 782, 798; 438/106, 122
See application file for complete search history.

(56) References Cited

U.S. PATENT DOCUMENTS

| | | | |
|---|---|---|---|
| 6,097,602 A | 8/2000 | Witchger | |
| 2006/0228542 A1* | 10/2006 | Czubarow | ........... H01L 23/3737 428/323 |

(Continued)

FOREIGN PATENT DOCUMENTS

| | | |
|---|---|---|
| WO | 02085339 A1 | 10/2002 |
| WO | 2009129237 A1 | 10/2009 |

OTHER PUBLICATIONS

European Search Report for Application No. EP 18154348.9, dated Jul. 19, 2018, 5 pages.

*Primary Examiner* — S. V. Clark
(74) *Attorney, Agent, or Firm* — Brundidge & Stanger, P.C.

(57) ABSTRACT

A delivery roll (1) for thermal interface components, the roll comprising a carrier tape (10), an adhesive layer (10*a*), and a plurality of thermal interface components (20), wherein the adhesive layer (10*a*) is arranged on a surface of the carrier tape (10); each thermal interface component (20) comprises a top liner (22), a bottom liner (26) and a thermal interface pad (24) arranged therebetween; the carrier tape (10) supports the plurality of thermal interface components (20) by the adhesive adhering to the bottom liner (26) of each thermal interface component (20); and the plurality of thermal interface components (20) is arranged in a spaced apart manner along the carrier tape (10). The invention also relates to a manufacturing method for a delivery roll.

15 Claims, 7 Drawing Sheets

(56) References Cited

U.S. PATENT DOCUMENTS

| | | | |
|---|---|---|---|
| 2007/0228112 A1* | 10/2007 | Shi | H01L 21/6835 228/181 |
| 2008/0029882 A1* | 2/2008 | Fery | G05B 19/41865 257/712 |
| 2009/0166854 A1* | 7/2009 | Jewram | H01L 23/3735 257/713 |
| 2010/0129648 A1* | 5/2010 | Xu | H01L 23/4275 428/339 |

* cited by examiner

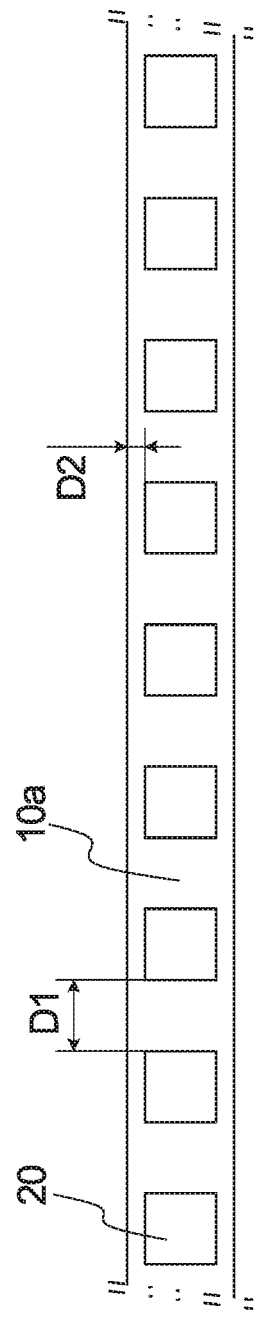
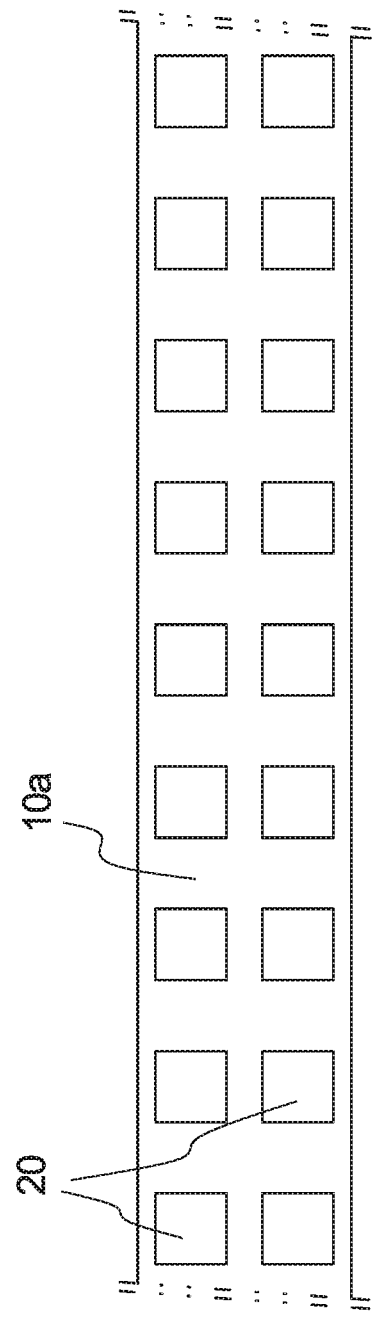
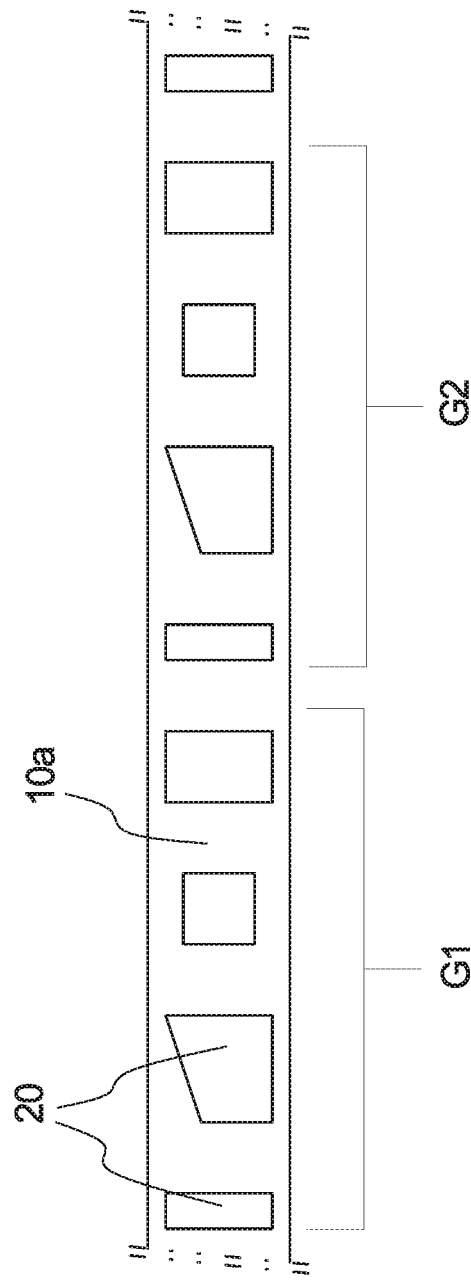

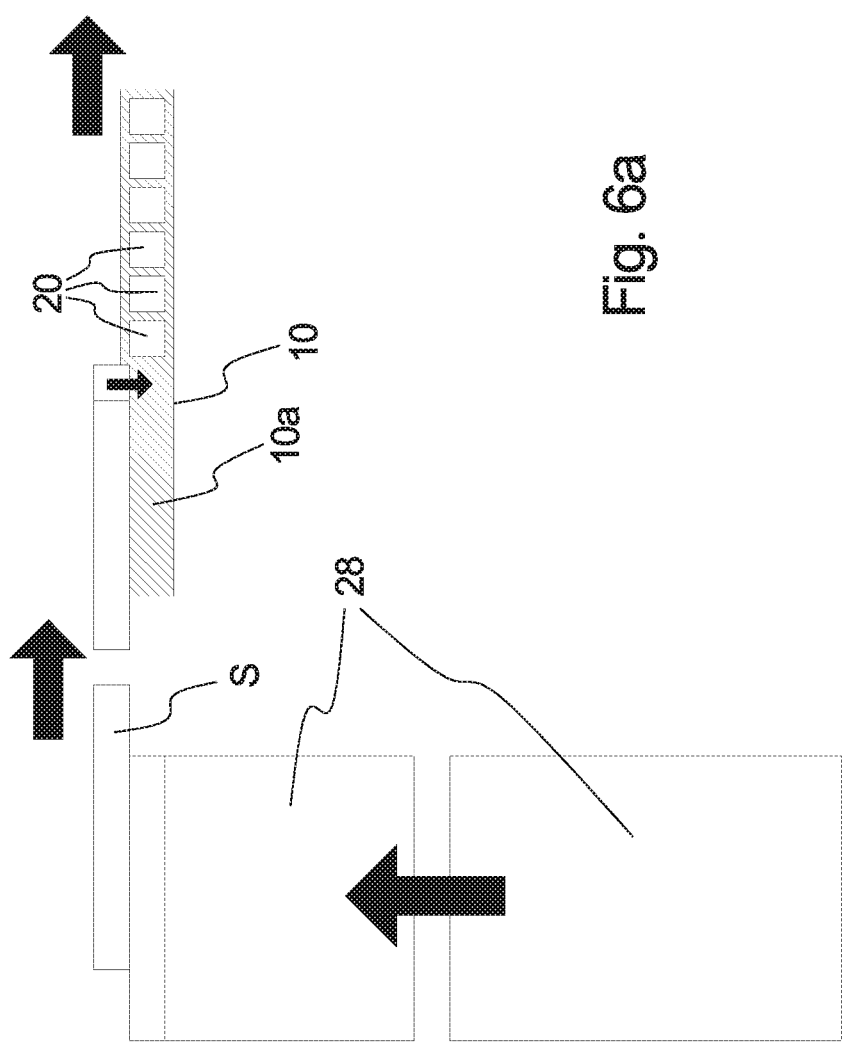

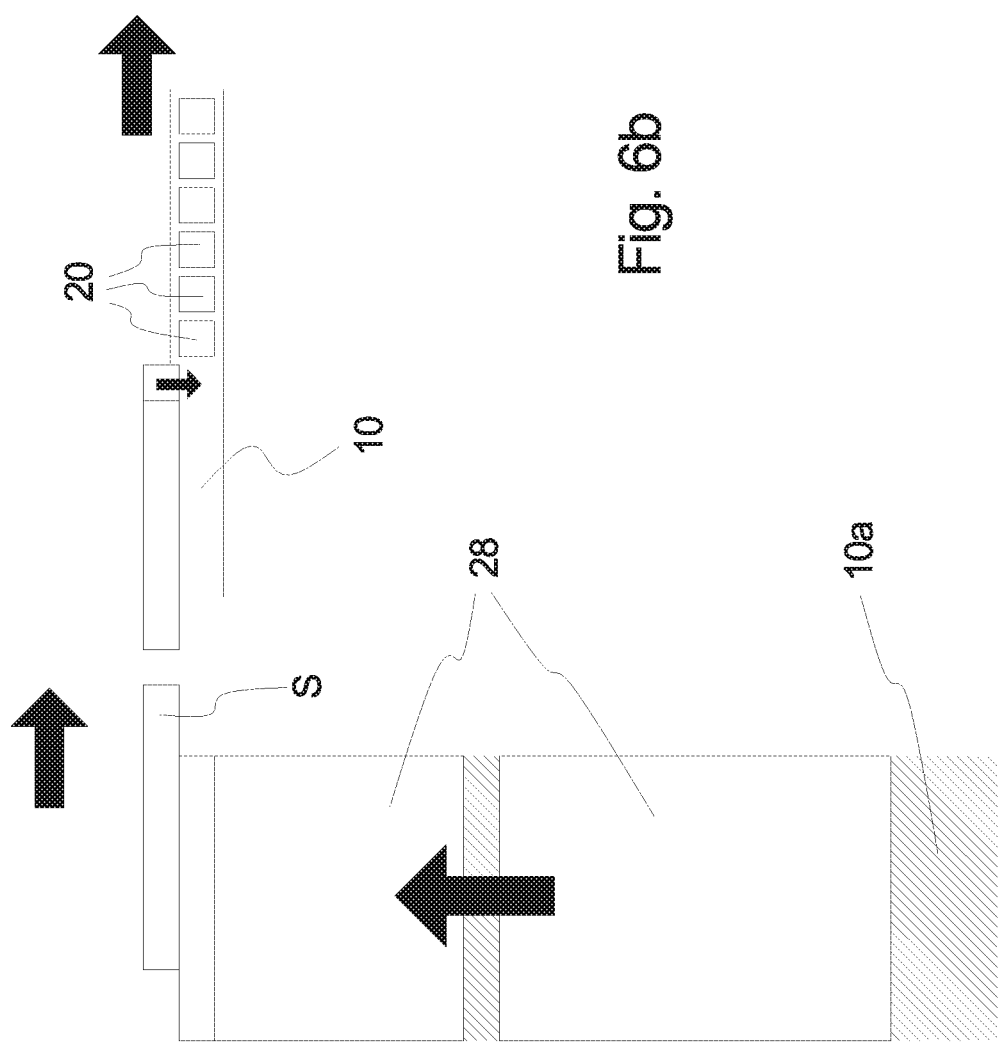

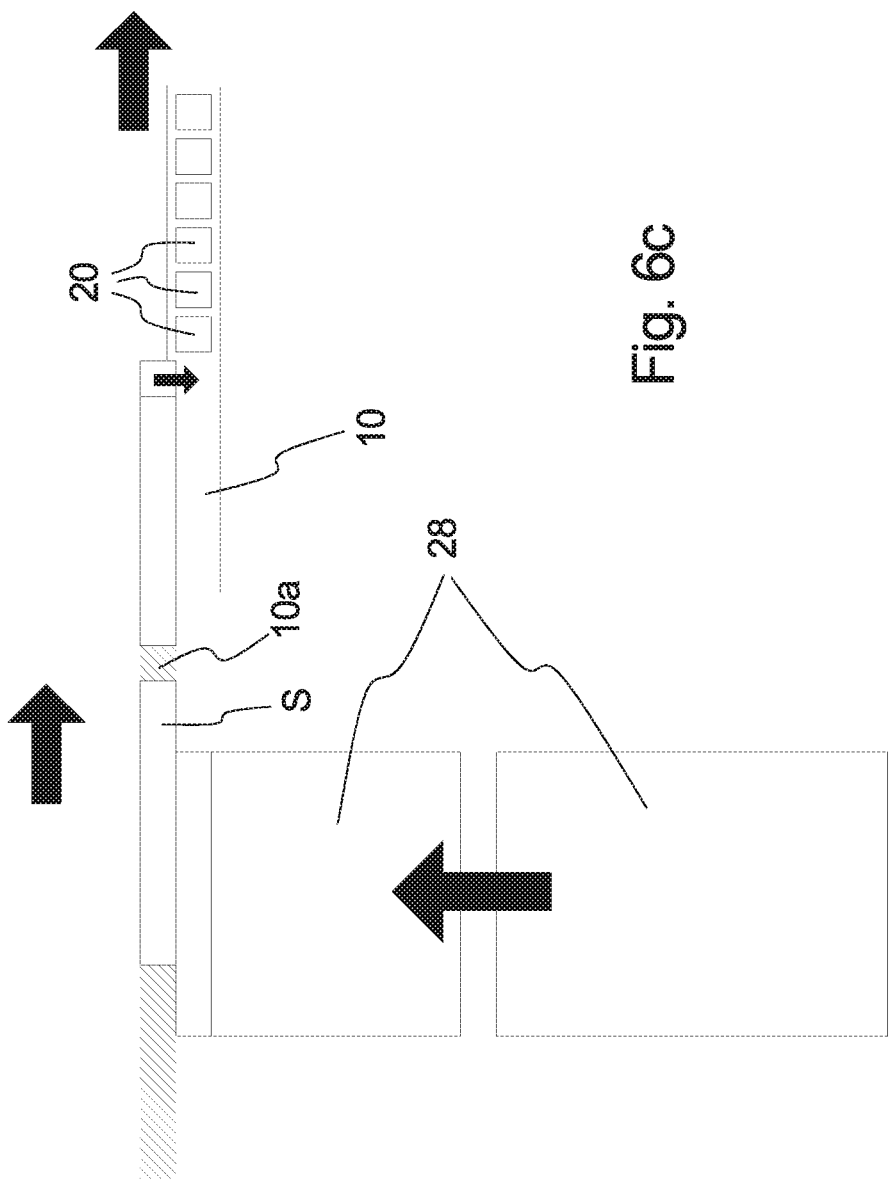

DELIVERY ROLL AND METHOD FOR MANUFACTURING THEREOF

CROSS-REFERENCE TO RELATED APPLICATION

This application claims the benefit under 35 USC 119(a) of European Patent Application No. 18154348.9 filed on Jan. 31, 2018, the entire disclosure of which are incorporated herein by reference for all purposes.

FIELD OF THE INVENTION

The invention relates to a delivery roll for components or pads of thermal interface material, and a method for the manufacturing thereof.

BACKGROUND ART

Within the field of electronics, cooling of components is often a necessity. Electronic components typically generate heat, and also often perform worse when they are hot. For this reason, different cooling methods may be employed. One category of cooling methods is known as air cooling, wherein the heat is conducted to a body with a high tendency to cool by convection, ie giving heat off to surrounding air. Such a body is commonly known as a heat sink, and may comprise metal fins for better dissipation of heat into the air, fans to blow air over the metal fins, heat pipes filled with phase-changing fluids to transport heat to the fins and so on. Heat sinks may be suitable for electronic components which have a good amount of surface area on which to mount the cooler. Mounting may be done by affixing a base plate of the heat sink to a surface area of the component to be cooled. The interface between this base plate and the electronic component should preferably have as large contact area as possible, as this may reduce thermal resistance. There are several ways of increasing contact area between the base plate of the heat sink and the component. One way is to increase the points of physical solid-to-solid contact in the interface by introducing a thermally conductive material able to mitigate the geometric differences between the surfaces and thereby displace any insulating air in the gap. Such material may be delivered in several different forms, such as thermal tape or thermal paste. One method is to use a thermal interface pad, which is a pad of thermally conductive elastomer material which may or may not have a degree of natural surface tack. This pad may then be applied to the surface of the heat sink, where its softness should be such that it interfaces well with said surface. Then, the heat sink may be pressed onto the pad. An adhesive may be used to hold the pad and heat sink in place, but it is also common to use pads made from waxy materials. These materials may have the advantage of having an inherent tackiness and may change phase, meaning melt or become soft, when heated, thereby improving thermal resistance, partly by displacing air more efficiently due to wetting of the surfaces, and partly by allowing the material to achieve a thinner thickness between the pad and the component. Such thermal interface pads may be covered with a liner during transport. They are also sometimes placed on rolls of tape for convenience, as they may become easier to transport. However, problems arise when such rolls are transported in conditions where ambient temperatures approach the phase-change temperature of the material. The thermal interface pads on a roll may melt together, rendering the roll unusable. Furthermore, if the edges of the roll are unprotected and the roll is stored next to similar rolls, entire rolls of thermal interface pads may melt together. For at least this reason, a need exists for a better way to handle materials used in cooling of electrical components.

SUMMARY OF THE INVENTION

In view of that stated above, the object of the present invention is to mitigate at least the problem of thermal interface pads melting together in warm conditions.

To achieve at least one of the above objects and also other objects that will be evident from the following description, a delivery roll having the features defined in claim 1 is provided according to the present invention. Preferred embodiments of the device will be evident from the dependent claims.

More specifically, there is provided according to the present invention a delivery roll for thermal interface components, the roll comprising a carrier tape, an adhesive layer, and a plurality of thermal interface components, wherein
the adhesive layer is arranged on a surface of the carrier tape;
each thermal interface component comprises a top liner, a bottom liner and a thermal interface pad arranged therebetween;
the carrier tape supports the plurality of thermal interface components by the adhesive adhering to the bottom liner of each thermal interface component; and the plurality of thermal interface components is arranged in a spaced-apart manner along the carrier tape.

In this manner, a delivery roll may be produced which is easy to handle. In hot conditions, the thermal interface pads may melt or become malleable, which may render the delivery roll unusable. However, distributing the thermal interface pads in a spaced-apart manner may prevent the thermal interface pads from melting into each other, potentially avoiding this problem. Furthermore, this enables for thermal interface components of different shapes and/or sizes to be arranged consecutively along the carrier tape.

The top and/or bottom liners of at least one of the thermal interface components may adhere to the associated thermal interface pad through an inherent tackiness of the thermal interface pad. This may have the advantage of enabling provision of top and/or bottom liners without need for adhesives.

The bottom liner may adhere to the adhesive layer with a first adhesive strength and wherein the bottom liner adheres to the thermal interface pad with a second adhesive strength, the first adhesive strength being greater than the second adhesive strength. When this is the case, removing the thermal interface pad from the carrier may cause the bottom liner to remain adhered to the adhesive. This may cause one side of the thermal interface pad to become exposed and ready to be applied to a component without the need to remove the bottom liner in an extra step. This may decrease the time of application of the thermal interface pads, and thus increase efficiency.

The plurality of thermal interface components may be subdivided into groups of thermal interface components, each group being formed of thermal interface components having at least two different shapes and/or two different sizes, wherein the thermal interface components of each group are distributed along the carrier in a pre-determined order and wherein the groups are distributed along the carrier in a sequence of groups.

This has the advantage of allowing groups to be created having thermal interface pads with shapes or sizes which may correspond to those needed for a certain component. In this manner, when mass-producing said component, it may be possible to retrieve the thermal interface pads needed for the component in sequence from the delivery roll without the need for additional delivery rolls.

The top liner and/or the bottom liner may be paper based. Paper is a suitable material as it may be porous and thus easily adhere to tacky materials, as well as cheap to produce and environmentally friendly.

The thermal interface pads may comprise an elastomer based material. Such a material may have the advantage of having an inherent tackiness. The elastomer material may be provided as a cured material or as a wax. The elastomer based material may comprise silicone but also other elastomers such as polyurethane and thermoplastic elastomers may be used.

The thermal interface pads may comprise a phase changing material. The phase changing material may be arranged such that it melts during use, i.e. when exposed to heat from the electronic device on which the thermal interface pad is intended to be applied. Hereby, an optimized heat transfer from an electronic device to a cooler may be ensured.

The phase changing material may comprise silicone wax. Silicone wax is suitable for use in thermal applications as it has desirable thermal and shape-keeping properties.

The thermal interface pads may further comprise a thermally conductive material distributed in the phase changing material. Distributing a thermally conductive material in the phase changing material may increase the thermal conductivity of the thermal interface pad, while lowering its heat-carrying capacity. This enables production of a thermal interface pad with desirable thermal characteristics.

The adhesive layer may be arranged on an inside of the roll such that the adhesive layer faces radially inwards towards a center of the roll in a wound/reeled state thereof. This enables production a delivery roll where the thermal interface components may be arranged on the inside surface of the rolled tape, and thereby be more protected when the roll is wound or reeled, enabling safer transport and handling of the roll itself.

The adhesive may be a pressure sensitive adhesive. Pressure sensitive adhesives may be advantageous as they may allow for different degrees of adherence of the thermal interface pads to the carrier tape.

The top liner may be provided with a tab. The tab may facilitate gripping the liner, which may make it easier to remove the liner after the thermal interface pad has been placed on a component or a heat sink.

In a second aspect, the invention also relates to a manufacturing method for a delivery roll, the method comprising:
  providing a plurality of thermal interface components each comprising a top liner, a bottom liner and a thermal interface pad arranged therebetween;
  deposing the thermal interface components into a magazine of thermal interface components;
  providing a carrier tape comprising an adhesive layer arranged on one side of the carrier tape;
  extending the carrier tape in a vicinity of the magazine of thermal interface components;
  ejecting, from the magazine, thermal interface components onto the adhesive layer of the extended carrier tape such that the bottom liner of each thermal interface component adheres to the adhesive layer of the extended carrier tape;
  winding up the carrier tape with the thereto adhered thermal interface components into a delivery roll for thermal interface components.

This method enables quick and efficient manufacture of a delivery roll for thermal interface components.

Providing a plurality of thermal interface components may further comprise providing thermal interface components having at least two different shapes and/or sizes, and wherein the thermal interface components are deposed in at least two magazines, each magazine holding thermal interface components of one size and/or shape.

The thermal interface components may be subdivided into groups of thermal interface components, each group being formed of thermal interface components having at least two different shapes and/or two different sizes, and wherein the groups are deposed in the magazine in a sequence of groups.

According to a third aspect of the present invention, a manufacturing method for a delivery roll is provided, the method comprising:
  providing a sandwich substrate comprising a top liner web, a bottom liner web, and a thermal interface pad material arranged therebetween;
  providing a carrier tape;
  separating an end portion from the sandwich substrate thereby forming a strip;
  separating an end portion from the strip thereby forming a thermal interface component comprising a top liner formed from said top liner web, a bottom liner formed from said bottom liner web and a thermal interface pad formed from said thermal interface pad material; and
  placing the thermal interface component on one side of the carrier tape, wherein an adhesive layer is arranged between the bottom liner of the thermal interface component and the carrier tape.

Hereby an alternative method is provided enabling quick and efficient manufacture of a delivery roll for thermal interface components.

By repeatedly separating end portions from the sandwich substrate, the sandwich substrate may be transformed into a plurality of strips.

By repeatedly separating end portions from the strips, each strip may be transformed into a plurality of thermal interface components.

The plurality of thermal interface components may be arranged on the carrier tape. Subsequently, the carrier tape supporting a plurality of thermal interface components may be wound up into a roll.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein:

FIGS. 5a, 5b and 5c are schematic views illustrating alternative layouts of thermal interface components on carrier tapes.

FIGS. 6a, 6b and 6c are schematic views illustrating alternative methods for manufacturing a delivery roll in accordance with the present invention.

DESCRIPTION OF EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
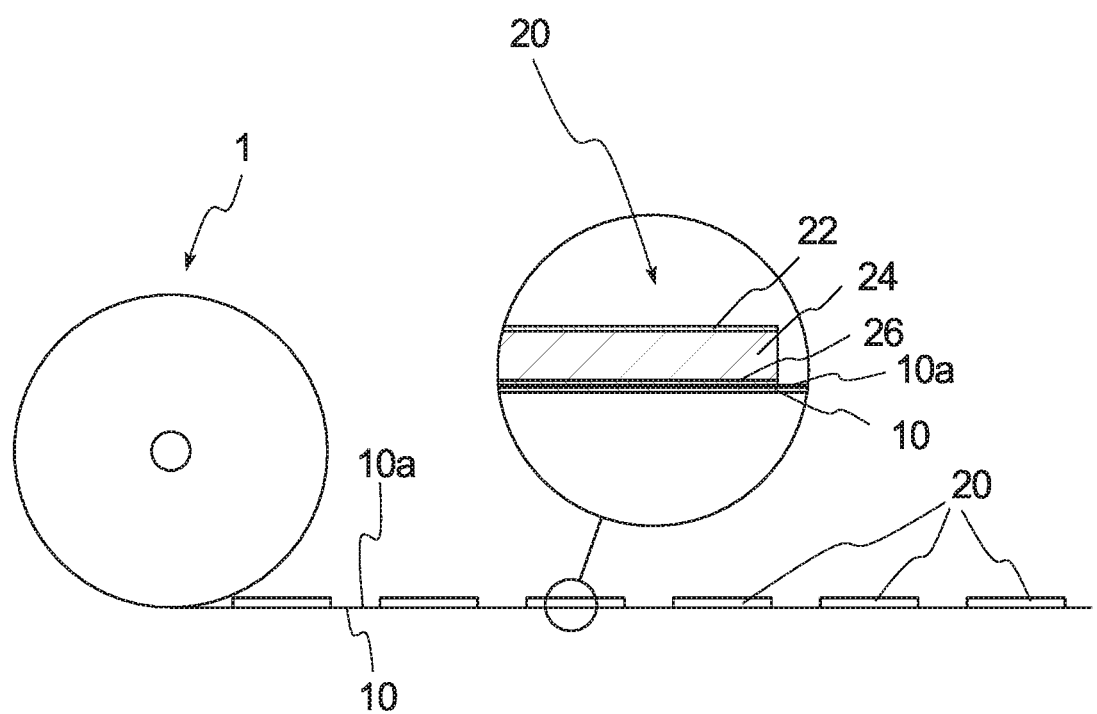
FIG. 1 is a schematic view of a delivery roll according to an embodiment of the present invention comprising thermal interface components.

In FIG. 1 is schematically disclosed a delivery roll 1 for thermal interface components 20. The roll comprises a carrier tape 10, partially wound up onto a roll. The carrier tape may preferably be made from a polymer material, but could conceivably be made from another material such as a paper-based material. The carrier tape 10 is coated on one side surface with an adhesive, forming an adhesive layer 10a. Several thermal interface components 20 are adhered to the adhesive layer 10a. Each thermal interface component 20 is formed from a thermally conductive material, forming a thermal interface pad 24, sandwiched between a top liner 22 and a bottom liner 26. The thermal interface components 20 will be further detailed below. The thermal interface components 20 are arranged with a first distance d1 between them as seen along the length of the carrier tape 10. The first distance d1 may for example be half the length of a thermal interface component 20 as seen along the carrier tape 10. The thermal interface components 20 are also separated from an edge of the carrier tape 10 by a second distance d2. These distances are shown more clearly in FIG. 5a. In FIG. 5b is shown a carrier tape 10 with thermal interface components 20 laid out in two rows instead of one, with a third distance (not marked) between them. It is of course possible to include as many rows of thermal interface components 20 as can be accommodated by the width of the carrier tape 10.

The thermal interface components 20 will now be described in more detail. The thermal interface pads 24 are made from silicone wax, which is a phase changing material. Other phase changing materials such as salt hydrates, paraffin or c-inorganic compounds could also be used, as well as other materials such as rubber. Silicone wax is preferable as it is malleable and tacky. The phase changing material may also be mixed with a more thermally conductive material such as graphite or metal particles.

The thermal interface pads 20 also comprise a top liner 22 and a bottom liner 26, each. The top and bottom liners 22, 26 are made from paper. The top and bottom liners 22, 26 may be made from other materials than paper such as plastic, vinyl or fabric. The top liner 22 covers the part of the thermal interface pad 24 facing away from the carrier tape 10. This protects the thermal interface pad 24 from particles such as dust or soot. The bottom liner 26 faces away from the top liner 22, and is adhered to the adhesive layer 10a of the carrier tape 10. The purpose of the bottom liner 26 is chiefly to control the degree of adhesion between the thermal interface pad 24 and the carrier tape 10, as well as to counteract adhesive from the adhesive layer 10a sticking to the thermal interface pad 24 after removal from the carrier tape 10, as such traces of adhesive could impair adhesiveness of the thermal interface pad 24 to the component it is intended to be used with. The top and bottom liners 22, 26 adhere to the thermal interface pad 24 by the thermal interface pad's 24 own inherent tackiness. The bottom liner 26 is more weakly adhered to the thermal interface pad 24 than to the carrier tape 10, and is thus configured to pull away from the thermal interface pad 24 when the thermal interface component 20 is removed from the carrier tape 10. This may be achieved by using an adhesive for the adhesive layer 10a which has a greater adhesive strength than the tackiness of the thermal interface pad 24 allows for. The adhesive layer 10a may be a pressure-sensitive adhesive such as butyl rubber, ethylene-vinyl acetate or styrene block copolymers. The top liner 22 may be provided with a tab (not pictured) extending away from the top liner 22. The purpose of the tab is to make the top liner 22 easier to remove after placing the thermal interface component 20 on a component.

The pictured thermal interface components 20 are of the same size and shape. However, this need not be the case. If the carrier tape 10 is sufficiently wide, larger thermal interface components 20 may be attached. The thermal interface pads 20 are also shown to be square, but may have any geometry. In FIG. 5c, a carrier tape 10 with a plurality of differently shaped thermal interface components 20 is shown. In this example, a group has been defined as having four different shapes of thermal interface pad 20a, 20b, 20c and 20d. Thermal interface strips 20 having the shapes 20a, 20b, 20c and 20d are laid out in order along the carrier tape 10. The first four thermal interface components 20 then define a group G1, with the next four thermal interface components 20 defining a group G2 and so forth. In this manner, thermal interface components 20 for use with a certain component may be stored on the same delivery roll 1 for use when mass-producing a component of this type. This may eliminate the need for several delivery rolls 1 carrying different shapes of thermal interface component 20.

Figure 3:
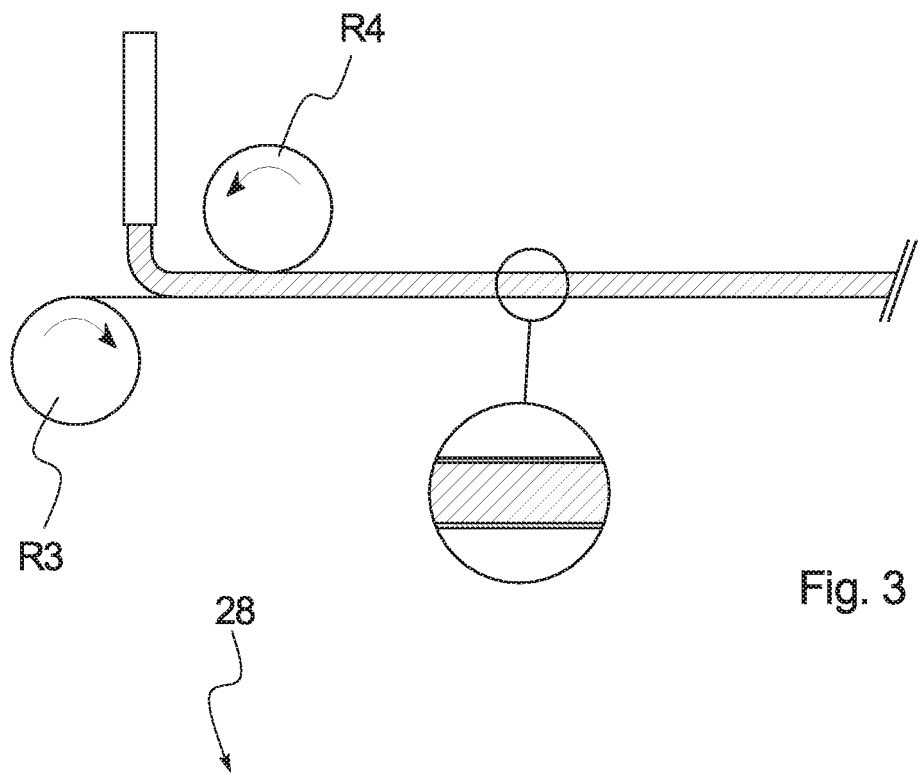
FIG. 3 is a schematic view illustrating a step for manufacturing thermal interface components.
Figure 4:
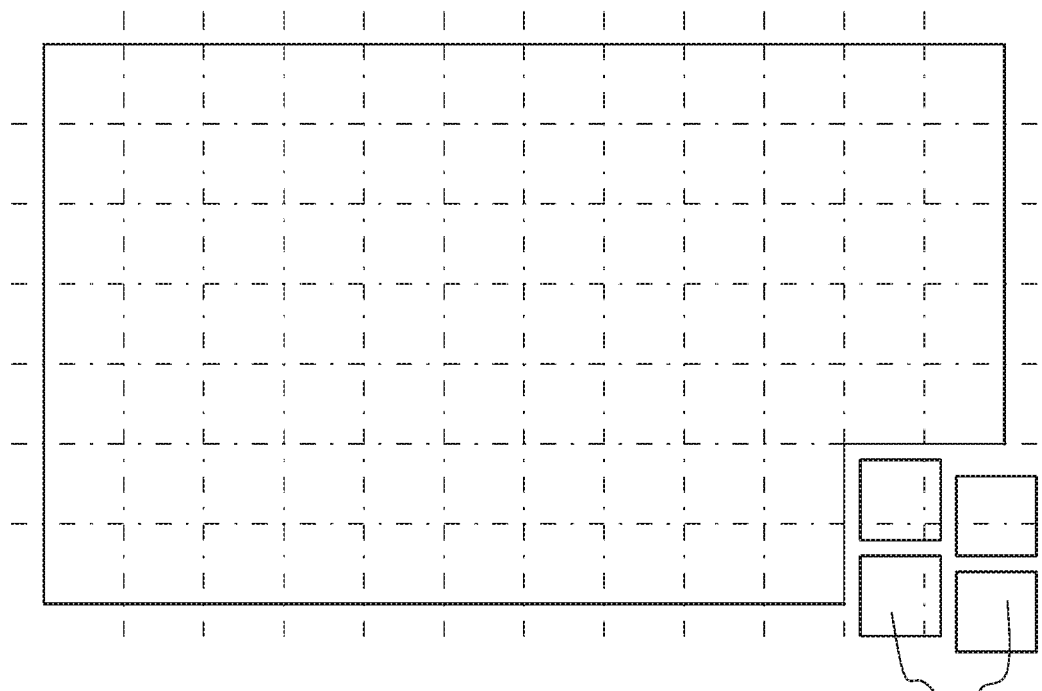
FIG. 4 is a schematic view illustrating a further step for manufacturing thermal interface components.

FIG. 3 schematically shows a manufacturing method for thermal interface pads 20. A flow of melted silicone wax carrying thermally conductive particles is directed onto a bottom liner web 26 unwound from a roller R3. A top liner web 22 is unwound from a roller R4 and arranged on top of the melted silicone wax supported by the bottom liner web 26. The combined web comprising the top liner web 22, the melted wax and the bottom liner web 26 may subsequently be cooled and cut up in sandwich sheets. In FIG. 4 is shown such a sandwich sheet 28 consisting of silicone wax sandwiched between top liner 22 material and bottom liner 26 material. Thermal interface components 20 may as illustrated be cut out of the sandwich sheet 28.

Figure 2:
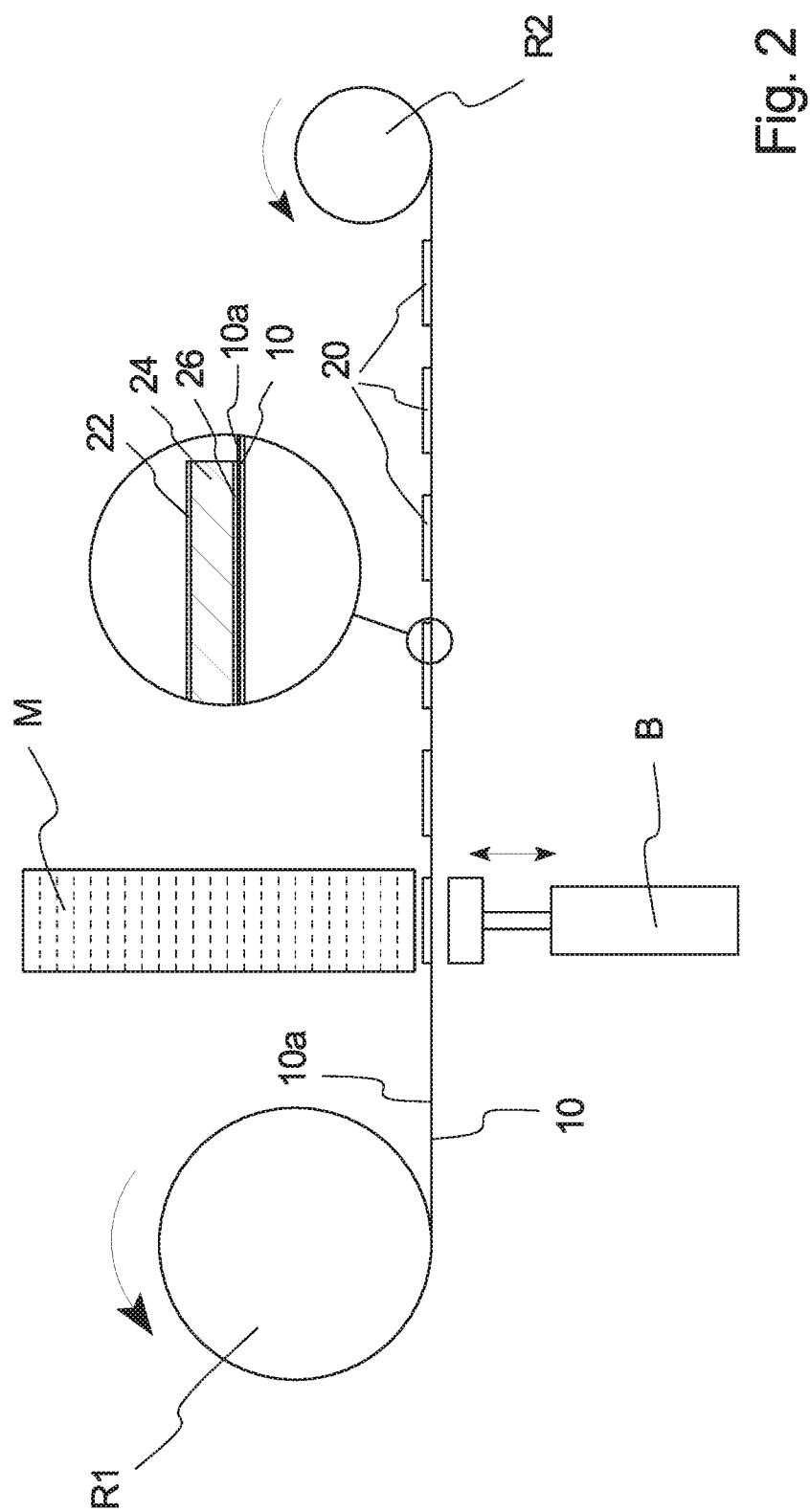
FIG. 2 is a schematic view illustrating a method for manufacturing of the delivery roll shown in FIG. 1.

A method for manufacturing a delivery roll 1 according to the above description will now be presented with reference to FIG. 2. A plurality of thermal interface components 20 are collected and deposed into a magazine M. A carrier tape 10 with pre-applied adhesive surface 10a is provided, and extended from a first roll R1, under the magazine M, and subsequently to a second roll R2. The second roll R2 is then rotated such that the carrier tape 10 is wound up on the second roll R2 from the first roll R1. As the carrier tape 10 travels under the magazine M, the thermal interface components 20 are ejected from the magazine M onto the adhesive surface 10a of the carrier tape 10. This is done in such a manner as to push the thermal interface components 20 firmly onto the adhesive surface 10a against an abutment B on the other side of the carrier tape 10 from the magazine M.

If different shapes and/or sizes of thermal interface components 20 are desirable on the same carrier tape 10, as discussed above, it is possible to provide two or more magazines M (not pictured) for the purposes of holding different shapes and/or sizes of thermal interface components 20.

Another way of providing thermal interface components 20 of different shapes and/or sizes is to load the magazine M with thermal interface components 20 sorted into groups as per the above description, loading the groups in sequence into the magazine.

The method described in the above section assumes the existence of ready-made thermal interface components 20. However, it is possible to manufacture the delivery roll 1 in tandem with manufacture of the thermal interface components 20. This is shown in FIGS. 6a, 6b and 6c. In FIG. 6a is disclosed a sandwich substrate, which may be in form of sandwich sheets 28, with the top and bottom liner webs 22, 26 applied to either side of a thermal interface pad material, such as a film of silicone wax containing thermally conductive particles. The sandwich sheet 28 is moved to a station at which an end portion is separated (for instance in a cutting operation) from the sandwich sheet 28 thereby forming a strip S, as illustrated by an arrow. By repeatedly separating end portions from the sandwich sheet 28, the entire sheet 28 may be transformed into strips S. Said strip S is then moved to a second station, as illustrated by a second arrow. Rather than being placed in a magazine M for later dispensation onto the carrier tape 10, the thermal interface components 20 are cut directly from the strip S by repeatedly separating end portions until the entire strip S has been transformed into a plurality of thermal interface components 20. Each separated thermal interface component 20 is placed immediately onto the pre-applied adhesive surface 10a of the carrier tape 10 as indicated by a third arrow. The carrier tape 10 is then taken to be rolled into a distribution roll 1, as indicated by a fourth arrow.

In FIG. 6b, a variation of this method is shown, wherein the adhesive surface 10a is not pre-applied to the carrier tape 10. Instead, the adhesive surface 10a is applied to the bottom liner of the sandwich substrate, which in the shown embodiment is in the form of sheets 28, which are then cut into strips S. These are then further cut into thermal interface components 20 for direct application to the carrier tape 10 as in FIG. 6a.

In FIG. 6c, a further variant is shown wherein the adhesive layer 10a is applied to the strips S before said strips S are cut into thermal interface components 20 for direct application onto the carrier tape 10.

It will be appreciated that the present invention is not limited to the embodiments shown. Several modifications and variations are thus conceivable within the scope of the invention which thus is exclusively defined by the appended claims.

The invention claimed is:

1. A delivery roll for thermal interface components, the roll comprising a carrier tape, an adhesive layer, and a plurality of thermal interface components, wherein
    the adhesive layer is arranged on a surface of the carrier tape;
    each thermal interface component comprises a top liner, a bottom liner and a thermal interface pad arranged therebetween;
    the carrier tape supports the plurality of thermal interface components (20) by the adhesive layer adhering to the bottom liner of each thermal interface component; and
    the plurality of thermal interface components is arranged in a spaced apart manner along the carrier tape.

2. A delivery roll according to claim 1, wherein the top and/or bottom liners of at least one of the thermal interface components adhere to the associated thermal interface pad through an inherent tackiness of the thermal interface pad.

3. A delivery roll according to claim 1, wherein the bottom liner adheres to the adhesive layer with a first adhesive strength and wherein the bottom liner adheres to the thermal interface pad with a second adhesive strength, the first adhesive strength being greater than the second adhesive strength.

4. A delivery roll according to claim 1 wherein the plurality of thermal interface components is subdivided into groups of thermal interface components, each group being formed of thermal interface components having at least two different shapes and/or two different sizes, wherein the thermal interface components of each group are distributed along the carrier in a pre-determined order and wherein the groups are distributed along the carrier in a sequence of groups.

5. A delivery roll according to claim 1, wherein the top liner and/or the bottom liner are paper based.

6. A delivery roll according to claim 1, wherein the thermal interface pads comprise a phase changing material.

7. A delivery roll according to claim 6, wherein the phase changing material comprises silicone wax.

8. A delivery roll according to claim 6, wherein the thermal interface pads further comprise a thermally conductive material distributed in the phase changing material.

9. A delivery roll according to claim 1 wherein the adhesive layer is arranged on an inside of the roll such that the adhesive layer faces radially inwards towards a center of the roll in a wound/reeled state thereof.

10. A delivery roll according to any of claim 1, wherein the adhesive is a pressure sensitive adhesive.

11. A delivery roll according to claim 1, wherein the top liner is provided with a tab.

12. A manufacturing method for a delivery roll, the method comprising:
    providing a plurality of thermal interface components each comprising a top liner, a bottom liner and a thermal interface pad arranged therebetween;
    deposing the thermal interface components into a magazine (M) of thermal interface components;
    providing a carrier tape comprising an adhesive layer arranged on one side of the carrier tape;
    extending the carrier tape in a vicinity of the magazine of thermal interface components;
    ejecting, from the magazine, thermal interface components onto the adhesive layer of the extended carrier tape such that the bottom liner of each thermal interface component adheres to the adhesive layer of the extended carrier tape;
    winding up the carrier tape with the thereto adhered thermal interface components into a delivery roll for thermal interface components.

13. A manufacturing method according to claim 12, wherein providing a plurality of thermal interface components further comprises providing thermal interface components having at least two different shapes and/or sizes, and wherein the thermal interface components are deposed in at least two magazines, each magazine holding thermal interface components of one size and/or shape.

14. A manufacturing method according to claim 12, wherein the thermal interface components are subdivided into groups of thermal interface components, each group being formed of thermal interface components having at least two different shapes and/or two different sizes, and wherein the groups are deposed in the magazine in a sequence of groups.

15. A manufacturing method for a delivery roll, the method comprising:
- providing a sandwich substrate comprising a top liner web, a bottom liner web, and a thermal interface pad material arranged therebetween;
- providing a carrier tape;
- separating an end portion from the sandwich substrate thereby forming a strip;
- separating an end portion from the strip thereby forming a thermal interface component comprising a top liner formed from said top liner web, a bottom liner formed from said bottom liner web and a thermal interface pad formed from said thermal interface pad material;
- placing the thermal interface component on one side of the carrier tape, wherein an adhesive layer is arranged between the bottom liner of the thermal interface component and the carrier tape.

* * * * *